United States Patent [19]
Ohsawa

[11] Patent Number: 5,416,741
[45] Date of Patent: May 16, 1995

[54] SEMICONDUCTOR MEMORY WITH BUILT-IN PARALLEL BIT TEST MODE

[75] Inventor: Takashi Ohsawa, Yokohama, Japan

[73] Assignee: Kabushiki Kaisha Toshiba, Kawasaki, Japan

[21] Appl. No.: 175,558

[22] Filed: Dec. 30, 1993

[30] Foreign Application Priority Data

Mar. 12, 1993 [JP] Japan ................... 5-051707

[51] Int. Cl.$^6$ ............................. G11C 7/00
[52] U.S. Cl. ..................... 365/201; 365/200; 365/230.03; 365/222
[58] Field of Search ............ 365/201, 200, 230.03, 365/222

[56] References Cited

U.S. PATENT DOCUMENTS

| | | | |
|---|---|---|---|
| 4,541,090 | 9/1985 | Shiracasawa | 365/201 |
| 4,672,582 | 6/1987 | Nishimura et al. | 365/201 |
| 4,873,669 | 10/1989 | Furutani et al. | 365/201 |
| 5,265,100 | 11/1993 | McClure et al. | 365/201 |
| 5,285,419 | 2/1994 | Iyengar | 365/201 |
| 5,301,155 | 4/1994 | Wada et al. | 365/201 |

*Primary Examiner*—Joseph A. Popek
*Assistant Examiner*—Tan Nguyen
*Attorney, Agent, or Firm*—Banner, Birch, McKie & Beckett

[57] ABSTRACT

Disclosed is a semiconductor memory with a built-in test mode which can freely change the width of parallel test bits. This semiconductor memory has pairs of data read/write (RWD) lines commonly provided for each block of a memory cell array laid out as a plurality of blocks, DQ buffers for each amplifying data output on associated pairs of DQ lines from an associated block and sending the amplified data in read mode, and writing data, written on those associated RWD lines, on the associated pairs of DQ lines in write mode. The semiconductor memory further has a test circuit which, in parallel bit test mode, enables those DQ buffers equal or greater in number than those DQ buffers needed for normal reading/writing to connect the associated pairs of RWD lines in wired-OR fashion and read out the results of computation of pieces of data, which are equal to or greater in number than the pairs of RWD lines, onto the pairs of RWD lines in read mode, and to write the same data on those plural pairs of RWD lines equal to or greater in number than the pairs of RWD lines.

17 Claims, 17 Drawing Sheets

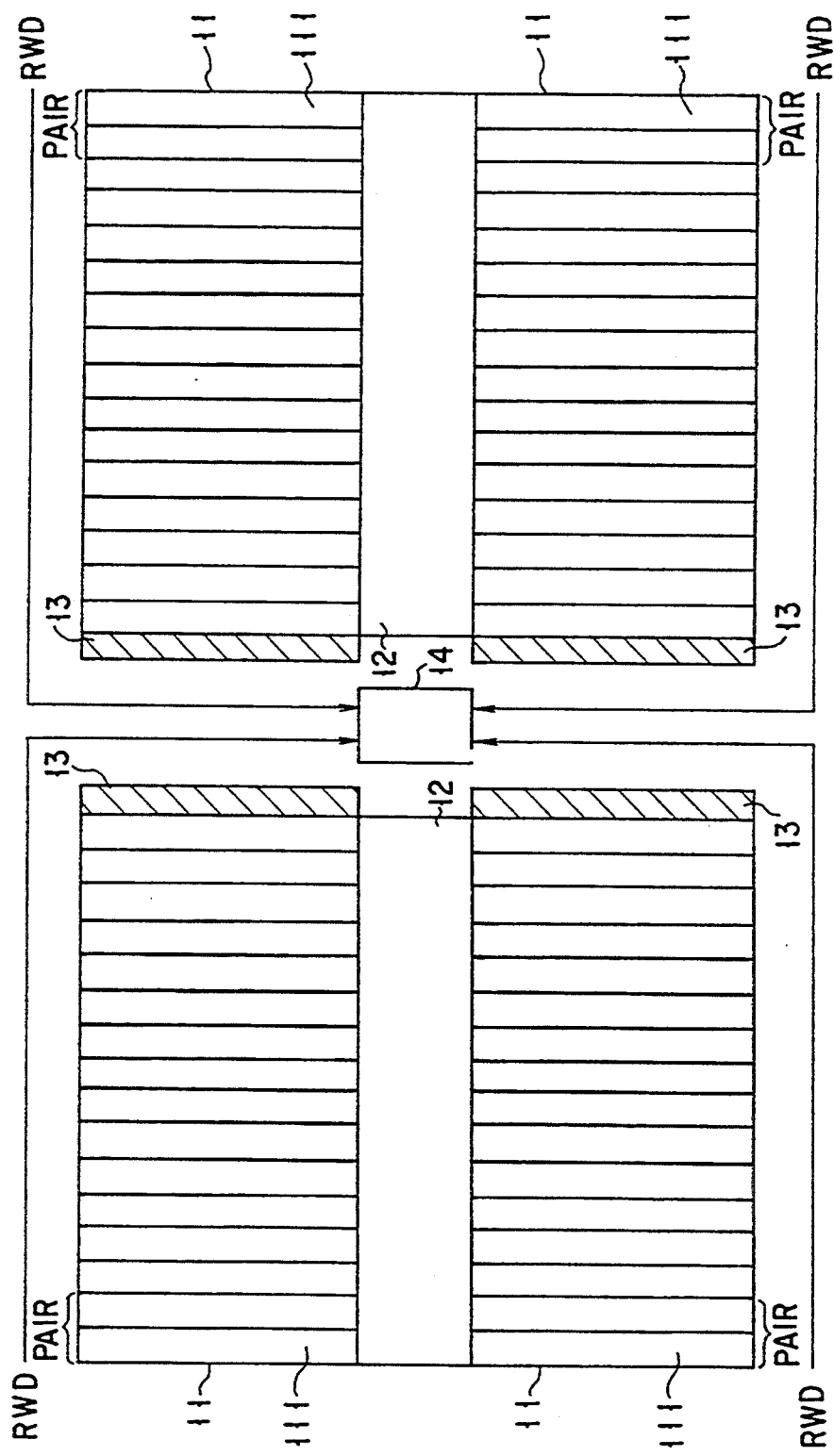
F I G. 1

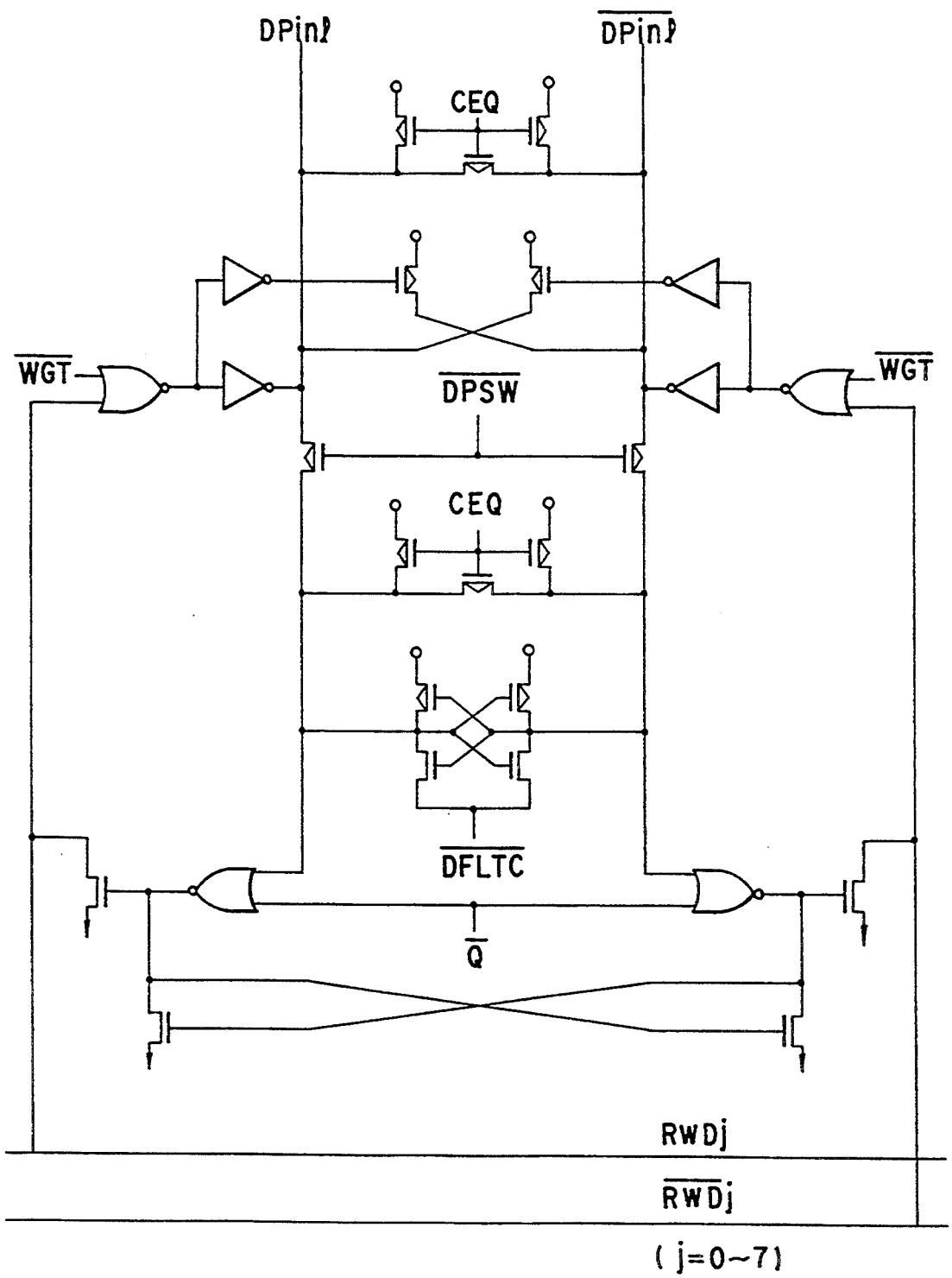
F I G. 8

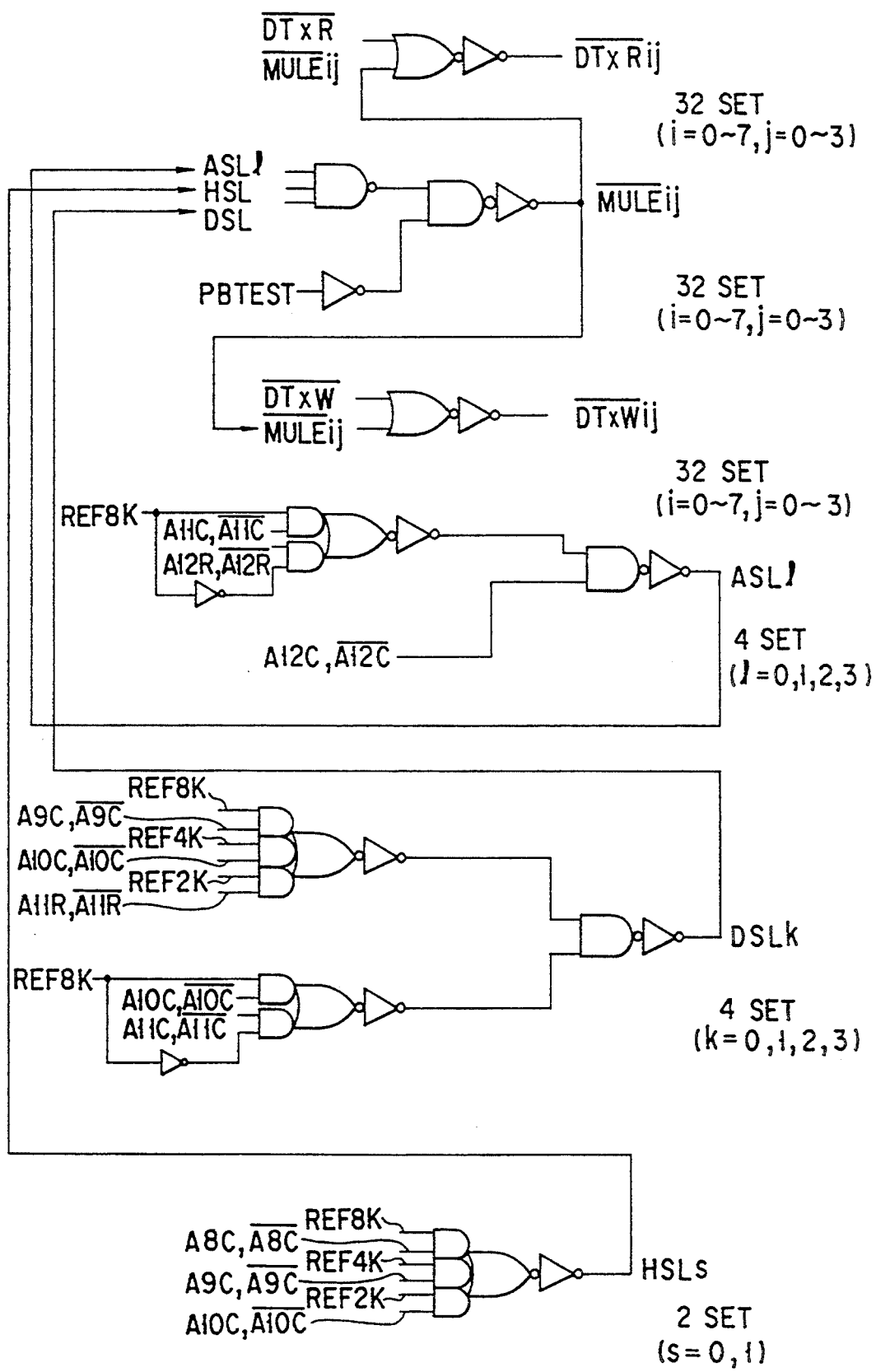
F I G. 17

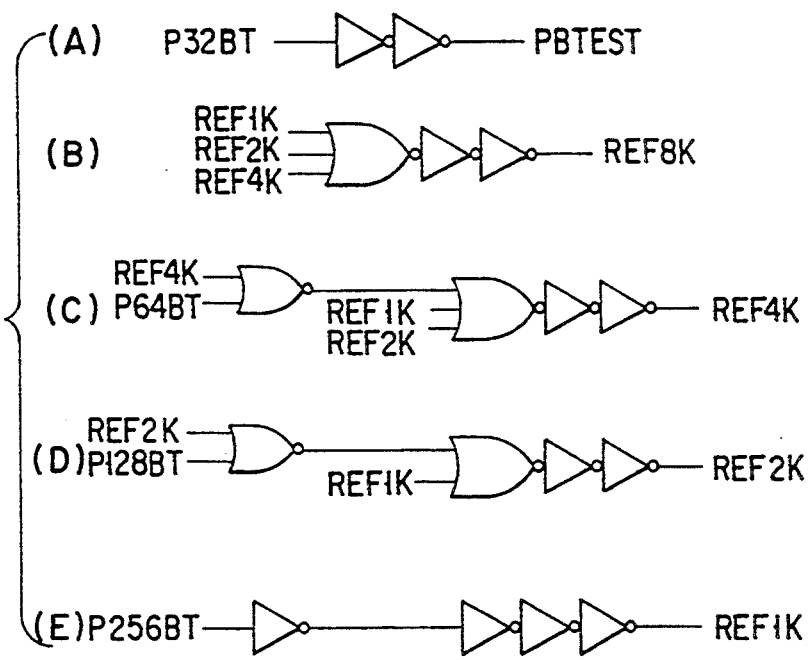
FIG. 18A
| | P32BT | P64BT | P128BT | P256BT |
|---|---|---|---|---|
| 32 bit PARALLEL TEST | H | L | L | L |
| 64 bit PARALLEL TEST | H | H | L | L |
| 128 bit PARALLEL TEST | H | H | H | L |
| 256 bit PARALLEL TEST | H | H | H | H |
FIG. 18B
| | REF8K | REF4K | REF2K | REF1K |
|---|---|---|---|---|
| 8K FRESH CYCLE | H | L | L | L |
| 4K FRESH CYCLE | L | H | L | L |
| 2K FRESH CYCLE | L | L | H | L |
| 1K FRESH CYCLE | L | L | L | H |
FIG. 18C
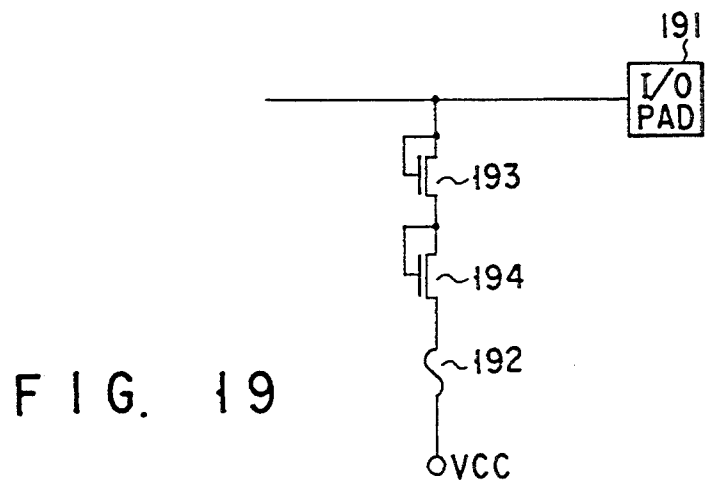
FIG. 19

SEMICONDUCTOR MEMORY WITH BUILT-IN PARALLEL BIT TEST MODE

BACKGROUND OF THE INVENTION

1. Field of the Invention

The present invention relates to a semiconductor memory and, more particularly, to a semiconductor memory with a built-in parallel bit test mode.

2. Description of the Related Art

Recent dynamic semiconductor memories (DRAMs) have a parallel bit test mode for performing a parallel test of a plurality of bits in order to shorten the test time.

This parallel bit test mode is to access a plurality of bits of a DRAM even with a x1 bit structure, instead of performing writing/reading one bit at a time to test the memory function bit by bit, or to access more bits than the number of inputs/outputs (I/O) for a DRAM with a multi-bit structure, thereby testing the functions of many bits simultaneously. That is, this test mode simultaneously write the same data in n-bit memory cells, simultaneously reads the n-bit data in read mode to determine if each piece of data matches with the written data, and outputs "1" or "0" in accordance with the matched/unmatched result.

This parallel bit test mode can reduce the number of cycles to access all the bits to 1/n (n: the number of bits) and can significantly shorten the test time.

An 8-bit parallel bit test mode that was standardized in JEDEC (Joint Electron Device Engineering Council) has been implemented in a 4M DRAM with a structure of 4M words×1 bit to which the parallel bit test mode was introduced first.

As the degree of the integration of DRAMs was increased, the number of bits to be simultaneously tested in parallel bit test mode was also increased to minimize an increase in test time. The individual makers tended to implement a 16-bit parallel mode in 16M DRAMs with a structure of 16M×1 bit and implement a 32-bit parallel mode in 64M DRAMs.

While the aforementioned parallel bit test mode will contribute to shortening the test time, the parallel bit width has only been doubled for each generation, so that the time for accessing all the cells has been improved just twice from one generation to a higher one.

In this respect, it is expected that even the parallel bit test mode, which has been considered so far as contributable to shortening the test time, will eventually result in a very long test time for the future generations, thus making an increase in test cost inevitable.

In other words, with regard to semiconductor memories with the conventional parallel bit test mode built therein, as the generation of the memory capacity advances, the test time eventually becomes very long so that the test cost will inevitably increase.

SUMMARY OF THE INVENTION

It is therefore an object of the present invention to provide a semiconductor memory with a parallel bit test mode built therein, which can freely change the width of parallel test bits to thereby shorten the test time.

A semiconductor memory with a built-in parallel bit test mode comprises a memory cell array laid out as a plurality of blocks; plural pairs of data lines provided for each of the blocks; plural pairs of read/write lines commonly provided for and in a vicinity of each of the blocks; a plurality of DQ buffer circuits, respectively provided for the blocks, for each amplifying data output on the plural pairs of data lines from an associated one of the blocks and sending resultant amplified data onto those plural pairs of read/write lines which are associated with that block in read mode, and writing data, written on those associated plural pairs of read/write lines, on the associated plural pairs of data lines in write mode; and a test circuit for performing control in such a way that, when a parallel bit test mode is designated, the test circuit enables those DQ buffer circuits which are equal or greater in number than those DQ buffer circuits needed for normal reading/writing to connect the associated plural pairs of read/write lines in wired-OR fashion and read out results of computation of pieces of data, equal to or greater in number than the plural pairs of data read/write lines, onto the plural pairs of data read/write lines in read mode, and to write the same data on those plural pairs of data lines equal to or greater in number than the plural pairs of data read/write lines.

As the semiconductor memory of this invention has a system of connecting plural pairs of data read/write lines in wired-OR fashion to read data at the time of data reading in parallel bit test mode, a plurality of block enable signals to enable a plurality of blocks in a cell array are simultaneously made active to simultaneously activate a plurality of DQ buffer circuits connected to one pair of data read/write lines, so that plural pieces of data will be read on one pair of data read/write lines. Accordingly, the bit width can be made wider.

In write mode, the gates for writing data from plural pairs of data read/write lines to a pair of data lines are enabled in association with the activated blocks, thereby ensuring automatic data writing in the cells of a plurality of blocks.

With a 64M DRAM taken as an example, it is possible to widen the bit width to a 64-bit type, 128-bit type and 256-bit type besides the 32-bit parallel test mode that is considered to be standardized by the JEDEC. It is therefore possible to provide a DRAM that will make the test time shorter.

Additional objects and advantages of the invention will be set forth in the description which follows, and in part will be obvious from the description, or may be learned by practice of the invention. The objects and advantages of the invention may be realized and obtained by means of the instrumentallties and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a diagram illustrating the cell array structure of a 64M DRAM having a structure of 64M words×1 bit, which is a semiconductor memory with a built-in parallel bit test mode according to one embodiment of the present invention;

FIG. 8 is a circuit diagram showing one example of the DQ buffer in FIG. 3;

FIG. 17 is a circuit diagram showing one example of a generator for generating a /DTXRij signal in FIG. 6 and a /DTXWij signal in FIG. 15;

FIG. 18A is a circuit diagram showing one example of a generator for generating signals to determine refresh cycles, and FIGS. 18B and 18C are diagrams of truth tables showing the statuses of the refresh cycle control signal; and FIG. 19 is a circuit exemplifying a circuit used to add refresh cycle data to the DRAM in FIG. 1.

DETAILED DESCRIPTION OF THE PREFERRED EMBODIMENT

On embodiment of the present invention will now be described in detail referring to the accompanying drawings.

FIG. 1 illustrates the cell array structure of a 64M DRAM having a structure of 64M words×1 bit, which is a semiconductor memory with a built-in parallel bit test mode according to one embodiment of the present invention;

A 64M bit cell array (64M array) formed on the chip area is separated to four 16M bit array (16M array) 11, with a row decoder 12 commonly arranged between two 16M arrays adjacent in the row direction and a column decoder 13 arranged at one end of each 16M array in the column direction (the center side of the chip area). Each 16M array 11 is separated to 16 1M cell array blocks (1M blocks) 111. Eight pairs of data read/-write lines (RWD lines) are formed in association with and in the vicinity of each 16M array 11.

The reading system of the DRAM in FIG. 1 will be described in detail first.

Eight pairs of RWD lines corresponding to each 16M array 11 are connected to a read multiplexer 14.

Figure 2:
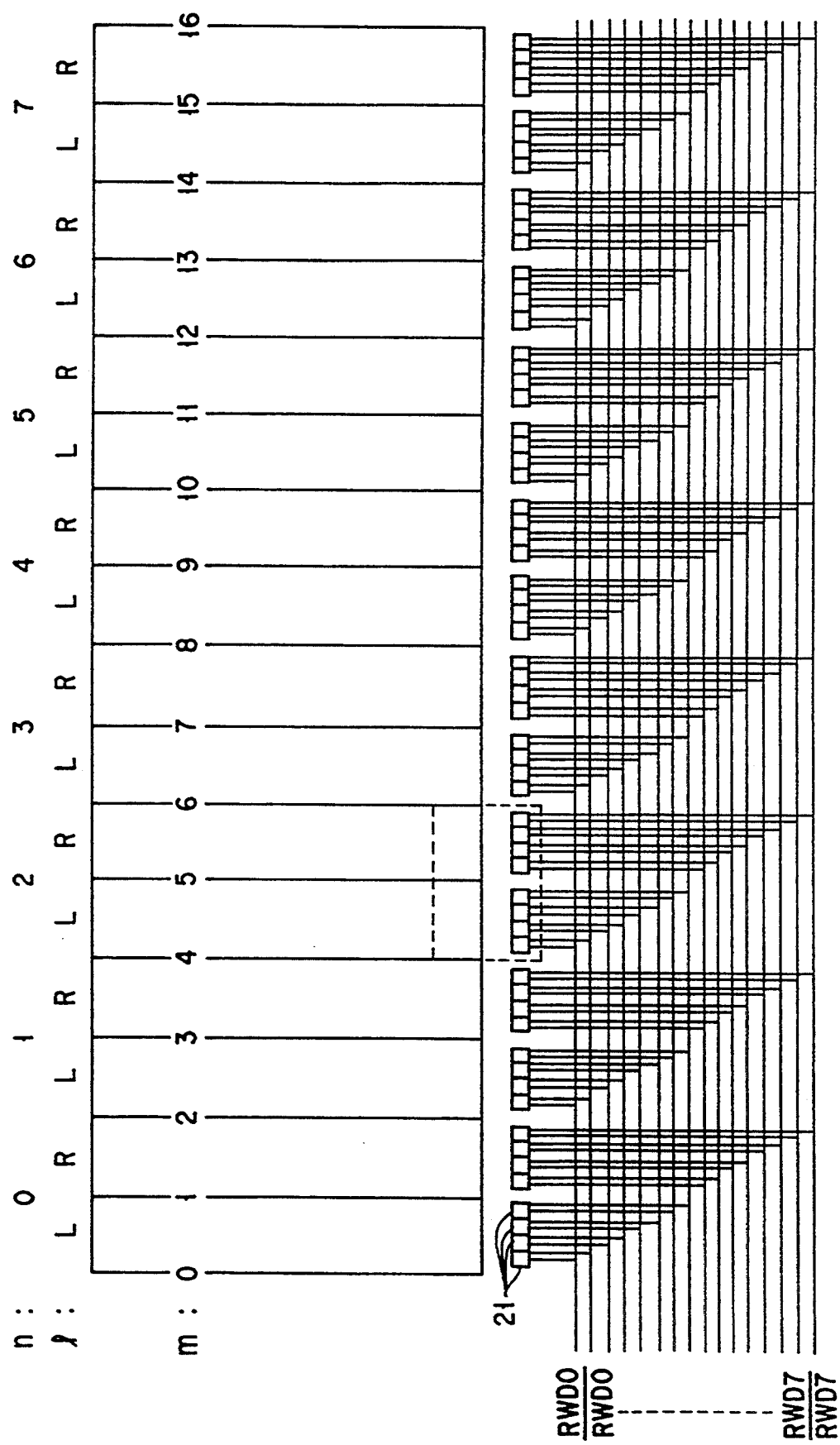
FIG. 2 is a detailed circuit diagram showing one of the 16M arrays in FIG. 1.

FIG. 2 presents detailed illustration of one of the 16M arrays in FIG. 1, and column select buffers (DQ buffers) and eight pairs of RWD lines associated with that 16M array.

Figure 3:
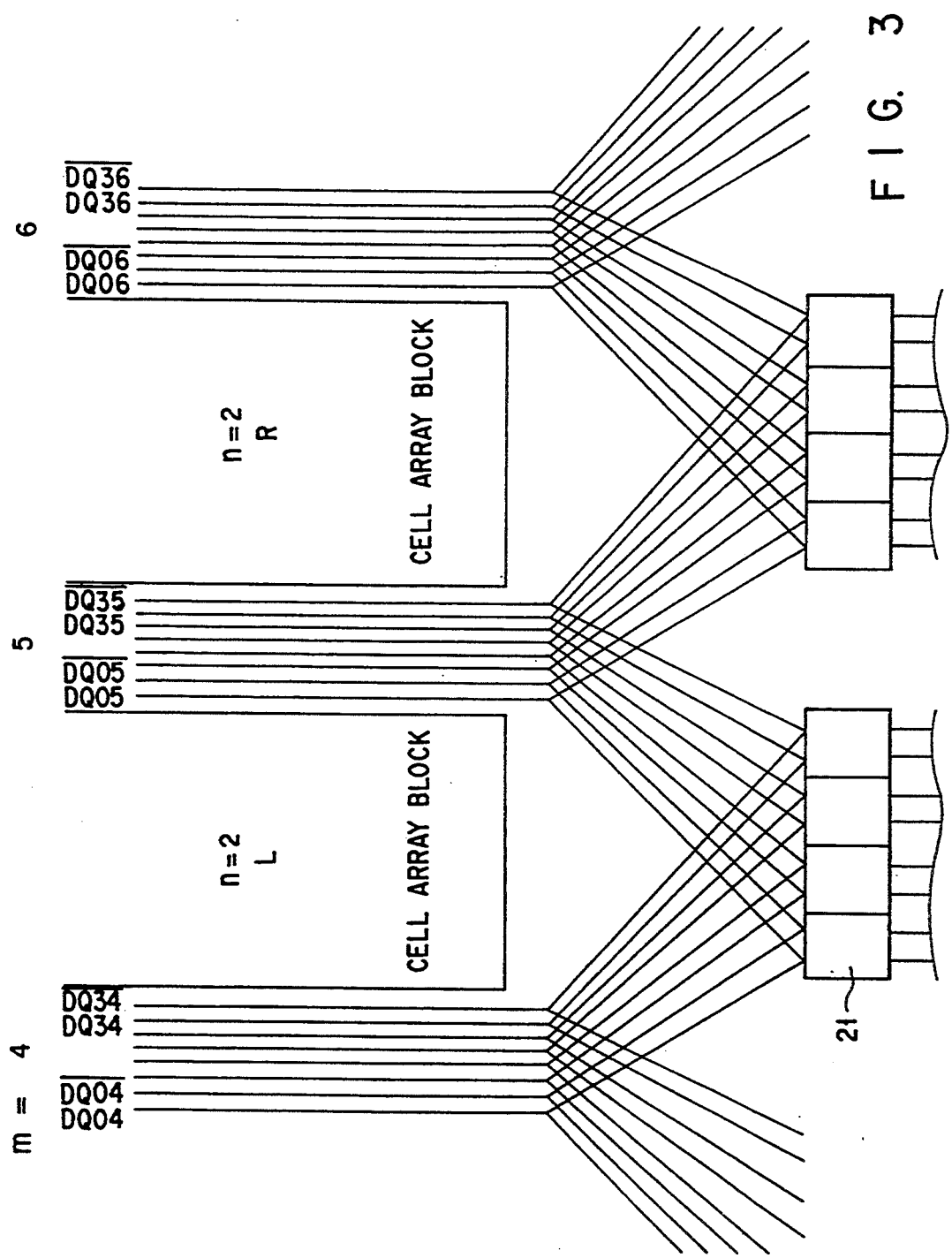
FIG. 3 is a detailed circuit diagram showing DQ buffers and DQ lines associated with one set of 1M blocks in FIG. 2.

FIG. 3 presents detailed illustration of the DQ buffers 21 and DQ lines associated with the portion indicated by the broken line in FIG. 2 (e.g., blocks L and R of n=2).

As shown in FIG. 2, there are eight sets of 1M blocks 111, each set consisting of two adjoining right and left blocks, in a 16M array. For the sake of convenience, the individual 1M blocks 111 are given set numbers n (0-7) and DQ line area numbers m (1-16), symbol L indicating the left block in each set and symbol R indicating the right block in each set.

As shown in FIG. 2, each block 111 is provided with four DQ buffers 21 and eight pairs of RWDi lines (i=0-7) are commonly provided in the vicinity of each block 111. As shown in FIG. 3, four pairs of data lines (DQ lines) run on both sides of the 16M array 11, i.e., outside the outermost block 111 (not shown) of each 16M array and between the individual blocks 111. As shown in FIG. 3, four pairs of DQ0i, /DQ0i lines to DQ3i, /DQ3i lines located on both sides of each block are connected to four DQ buffers 21 of the associated block as described later. As shown in FIG. 2, four DQ buffers 21 corresponding to the block L in each block set are connected to four pairs of RWD0, /RWD0 lines to RWD3, /RWD3 lines and four DQ buffers 21 corresponding to the block R in each block set are connected to the remaining four pairs of RWD4, /RWD4 lines to RWD7, /RWD7 lines. /DQ0i denotes a complemental logic level of DQ0i, and /DQ3i denotes a complemental logic level of DQ3i. The same is applied to various signals described hereinafter.

When the block L of n=2 is enabled, data is read on a total of eight pairs of DQ lines on both sides of this block. Those pieces of data are input to the eight DQ buffers 21 corresponding to blocks L and R of n=2, are amplified there and are then selectively output to eight pairs of the RWD0 line to the RWD7 line. In this case, DQ04 to DQ34 lines and /DQ04 to /DQ34 lines are input to the four DQ buffers 21 corresponding to the block L of n=2 and DQ05 to DQ35 lines and /DQ05 to /DQ35 lines are input to the four DQ buffers 21 corresponding to the block R of n=2.

When the block R of n=2 is enabled, on the other hand, likewise, data is read on a total of eight pairs of DQ lines on both sides of this block. Those pieces of data are input to the eight DQ buffers 21 corresponding to blocks L and R of n=2, are amplified there and are then selectively output to eight pairs of the RWD0 line to the RWD7 line. In this case, DQ05 to DQ35 lines and /DQ05 to /DQ35 lines are input to the four DQ buffers 21 corresponding to the block L of n=2 while DQ06 to DQ36 lines and /DQ06 to /DQ36 lines are input to the four DQ buffers 21 corresponding to the block R of n=2.

As two adjoining blocks R and L in each block set are not simultaneously enabled, the same DQ buffers can be shared by the right and left blocks as mentioned above.

Although the above description has been given with reference to the case where the blocks with the set number n=2 are enabled, the same applies to the case where another set of blocks are enabled. That is, pieces of data, read on a total of eight pairs of DQ lines, four pairs on each side of the enabled block, are input to a total of eight DQ buffers 21, four corresponding to each block L or R of that set, and are amplified there.

Figure 4:
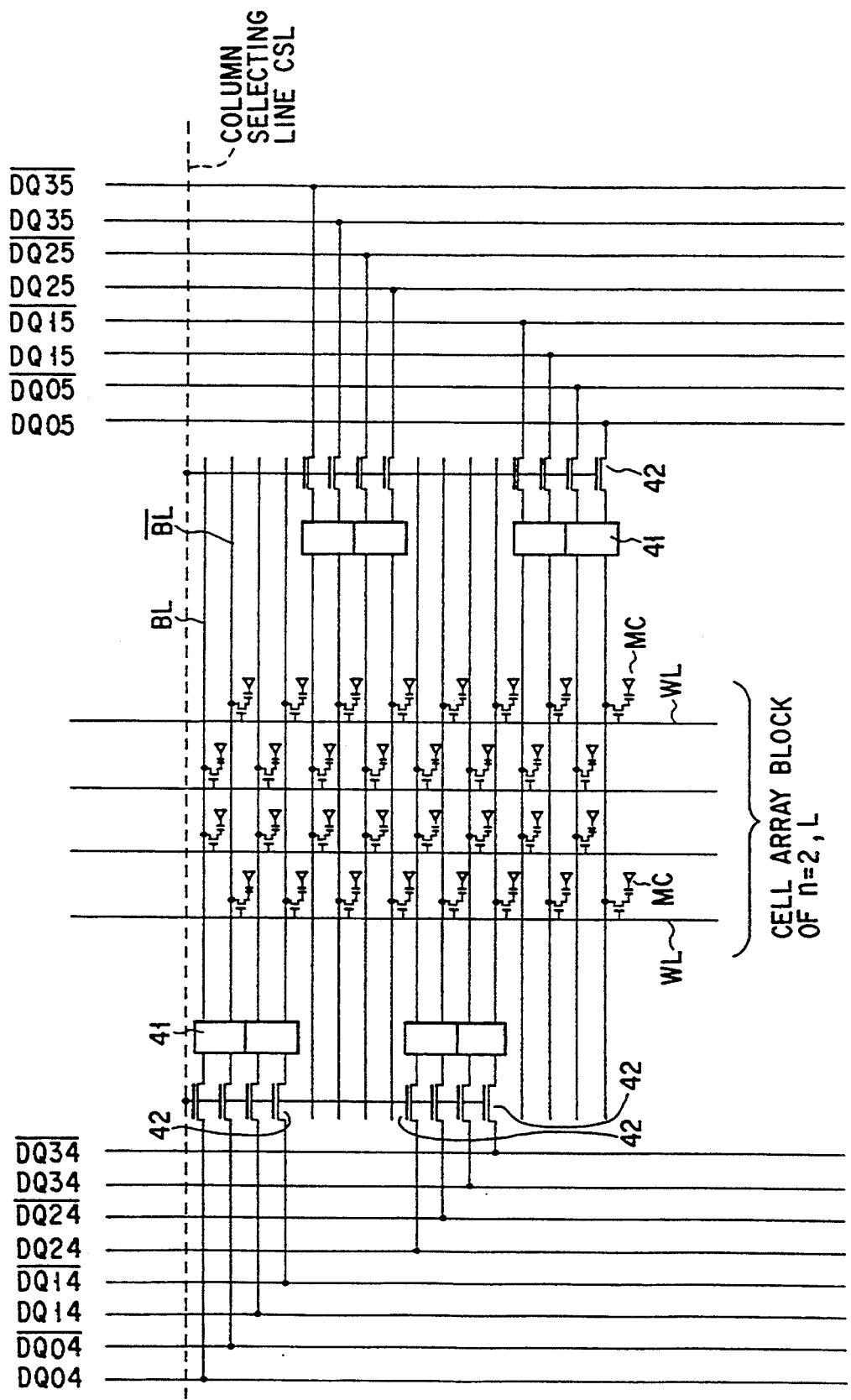
FIG. 4 is a circuit diagram showing in enlargement a part of a 1M block of n=2 and L in FIG. 3.

FIG. 4 shows in enlargement a part of the block L of n=2 in FIG. 3.

In this diagram, BL and /BL indicate eight pairs bit lines (16 bit lines), WL indicates four word lines, and MC indicate individual memory cells for 32 bits. Each memory cell MC comprises one MOS transistor and one capacitor, and is provided in the vicinity of where the bit line BL or /BL crosses the word line W.

Connected to each bit line pair BL and /BL (called a "column") is a sense amplifier/bit-line precharger 41, which includes a signal amplifier and a circuit for fixing the bit line pair to a predetermined potential before amplification. The circuits 41 are alternately arranged on the left and right sides of the block for every two pairs of bit lines BL and/BL.

A total of eight pairs of DQ lines, formed four pairs on each side of the block, are connected to eight pairs of bit lines BL and/BL via NMOS transistors (column select gates and DQ gates) 42 to the gates of which column select lines CSL are input.

This structure allows data of the memory cell MC selected by the word line WL to be amplified by the associated sense amplifier 41 and allows the data selected by a single line CSL to be read on a total of eight pairs of DQ lines on the right and left sides of the block.

Although FIG. 4 shows the structure associated with a single line CSL, this structure is actually repeated so that data is coupled to eight pairs of DQ lines for every eight columns for each line CSL.

Figure 5:
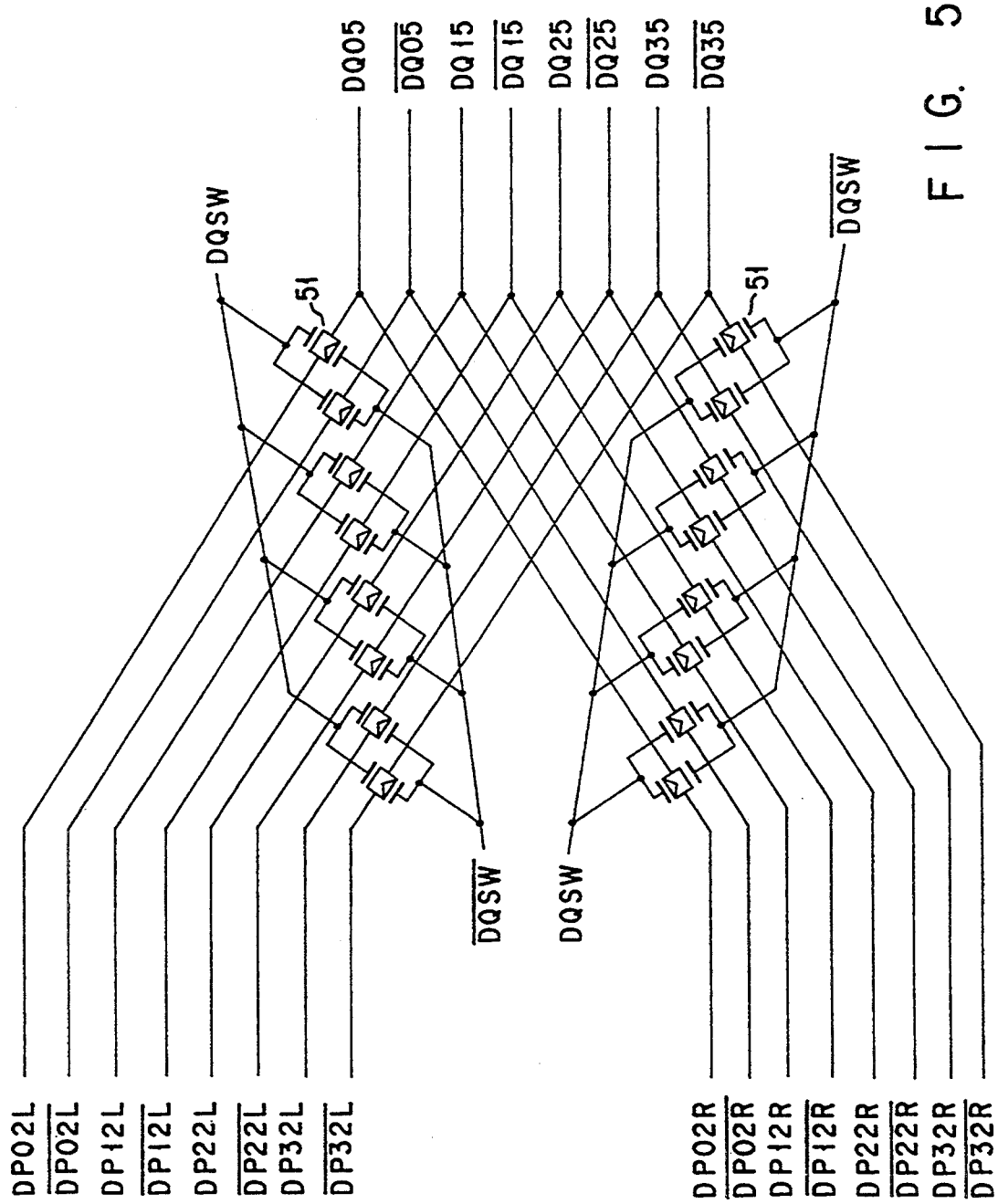
FIG. 5 is a circuit diagram showing one example of a switch circuit which allows data to be coupled to the DQ buffers shared by the right and left 1M blocks in FIG. 3.

FIG. 5 shows one example of a switch circuit which selectively couples one pair of DQ lines in FIG. 3 to those DQ buffers which are shared by the blocks L and R of n=2.

This switch circuit comprises a plurality of CMOS transfer gates 51 having their gates supplied with complementary signals DQSW and /DQSW.

In this diagram, DP02L, /DP02L to DP32L, /DP32L are DQ line pairs connected to the DQ buffers corresponding to the block L of n=2, and DP02R, /DP02R to DP32R, /DP32R are DQ line pairs connected to the DQ buffers corresponding to the block R of n=2.

Figure 6:
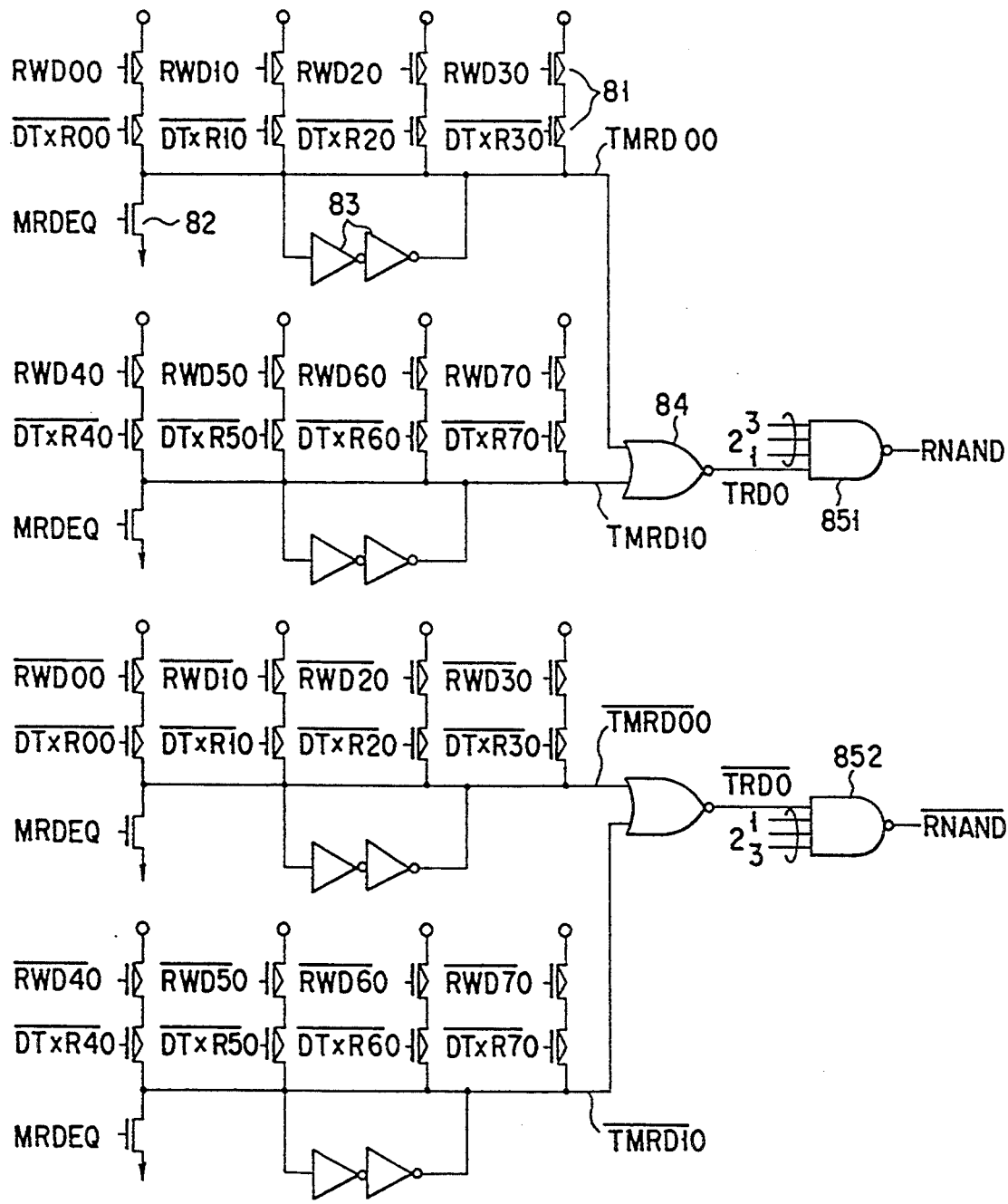
FIG. 6 is a circuit diagram showing one example of a read multiplexer in FIG. 1.

FIG. 6 exemplifies a read multiplexer in FIG. 1.

In this diagram, "81" is a PMOS transistor, "82" is an NMOS transistor, "83" is an inverter, "84" is a 2-input NOR gate and "851" and "852" are 4-input NAND gates.

Two sets of circuits, each having sixteen PMOS transistors 81, two NMOS transistors 82, four inverters 83 and two 2-input NOR gates 84 connected as illustrated, are provided in association with a single 16M array. TRDj (j=0–3), the output signals from the first set of circuits in each of four 16M arrays, are input to the first 4-input NAND gates 851 and /TRDj, the output signals from the second set of circuits, are input to the second 4-input NAND gates 852.

In each set of circuits above, before data is read in, an MRDEQ signal becomes "H" temporarily to turn on the N channel transistor 82, setting TMRD0j, TMRD1j, /TMRD0j and /TMRD1j, which are input nodes of the 2-input NOR gate 84, to a low level.

A description will now be given of the read operation of the read multiplexer in FIG. 6 in normal mode and data compressing operation of a plurality of bits in parallel bit test mode.

At the time of the reading operation of a DRAM with an ordinary x1-bit structure in normal mode, after one block 111 in each of four 16M arrays 11 are enabled and 8-bit data is output on eight pairs of RWD lines, only one of /DTXRi0-/DTRXi0 (i=0–7) signals which is selected by the address becomes a low level. Accordingly, 1-bit data on the RWD line is selectively sent to TMRD00, TMRD10 and /TMRD00, /TMRD10, and passes through the 2-input NOR gate 84 to become TRD0 and /TRD0 signals.

Likewise, data is output on the RWD lines for the other 16M arrays, but since TRDj and /TRDj from the other unselected 16M arrays have a high level, only the data from the selected 16M array passes through the 4-input NAND gate 85 to become RNAND and /RNAND signals.

At the time of the reading operation in parallel bit test mode, since /DTRX00 to /DTRX70 signals all become a low level, TRD0 or /TRD0 becomes a low level if there is any low-level signal among the RWD00 to /RWD70 data.

With no error, therefore, if all the RWD lines corresponding to four 16M arrays are at an "H" level, the RNAND signal becomes "L" and /RNAND signal becomes "H," and if all the RWD lines are at an "L" level, the RNAND signal becomes "H" and /RNAND signal becomes "L."

If there is an error even in one bit, on the other hand, there are L-level and H-level RWD lines, RNAND signal becomes "H" and /RNAND signal becomes "H."

Figure 7:
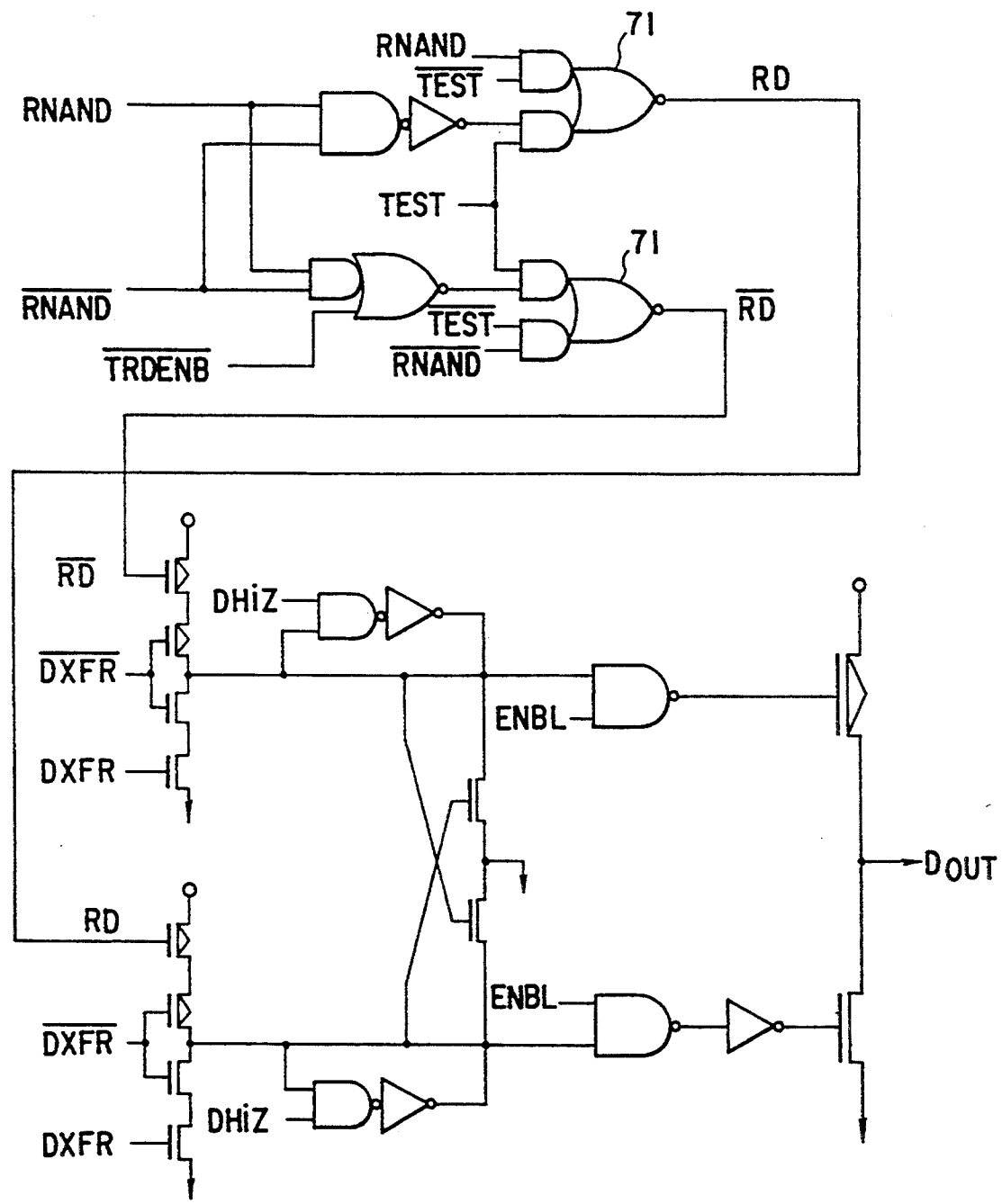
FIG. 7 is a circuit diagram showing one example of an output buffer circuit for outputting Dout upon reception of RNAND and /RNAND signals in FIG. 6.

FIG. 7 exemplifies a circuit for generating RD and /RD signals upon reception of RNAND and /RNAND signals from the read multiplexer in FIG. 6 and an output buffer circuit for outputting Dout upon reception of the RD and /RD signals.

In FIG. 7 the symbols of logic circuits are the same as or similar to those of the logic circuits shown in FIG. 6, and the description of each symbol will not be given. This also applies to the following description.

A /TRDENB signal is a sync signal which becomes "L" from "H" after the RNAND and /RNAND data are settled, and is generated by a timer in the chip area.

TEST and /TEST are mode indicating signals and ENBL is an output enable signal.

The operations of the circuits in FIGS. 6 and 7 will be described below.

At the time of the reading operation in normal mode, TEST="L" and /TEST="H" in FIG. 7, and the RNAND and /RNAND signals are output via an NOR gate 71 as RD and /RD signals, which are input to the output buffer circuit.

In this case, with the selected RWD and /RWD lines respectively being "H" and "L," RNAND="L" and /RNAND="H" so that RD="H" and /RD="L" and Dout becomes "1."

If the selected RWD and /RWD lines are respectively "L" and "H," Dout becomes "0."

At the time of the reading operation in parallel bit test mode, TEST="H" and /TEST="L."In this case, with no error, RNAND and /RNAND become complementary signals, RD="H" and /RD="L" and Dout becomes "1." That is, when 32 RWD lines are all "H" and 32 /RWD lines are all "L," RNAND="L" and /RNAND="H" and RD="H" and /RD="L."Likewise, when 32 RWD lines are all "L" and 32 /RWD lines are all "H," RNAND="H" and /RNAND="L" and RD="H" and /RD="L."

If there is at least one error (if L-level and H-level lines are mixed in the 32 RWD lines and /RWD lines), on the other hand, RNAND="H" and /RNAND="H", RD="L" and /RD="H" and Dout becomes "0." If the same written pieces of data (8×4=32 bits in this example) are all in error and all the pieces of data are inverted, Dout becomes "1" although it is actually an error. In this case, it is erroneously judged that there is no error, but the probability of the occurrence of this event is too small to raise any practical problem.

Through the above-described operations, when the same pieces of data are written, it is possible to determined if they are aligned, and with no error, Dout becomes "1" and with at least one error, Dout becomes "0."

FIG. 8 is a circuit diagram showing one example of the DQ buffer in FIG. 3.

In this diagram, DPin1 and /DPin1 (i=0-3, n=0-7 and 1=L, R) are pairs of DQ lines connected to the associated DQ buffers (i=0-3, n=0-7 and 1=L, R). As the structure of the DQ buffer itself is well known, its description will not be given below.

Figure 9:
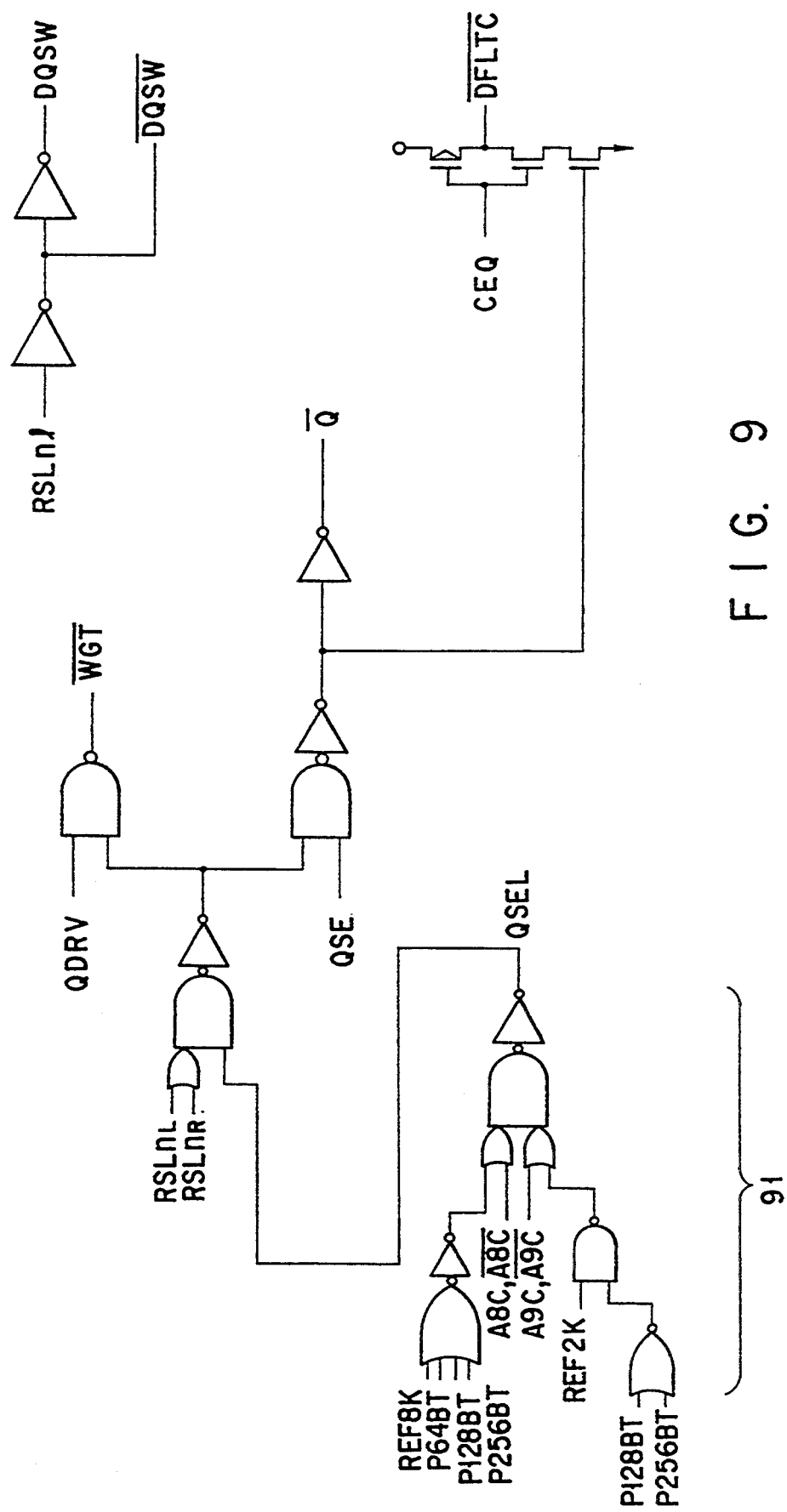
FIG. 9 is a circuit diagram showing one example of a generator for generating a control signal for the DQ buffer in FIG. 8.

FIG. 9 exemplifies a generator for generating a control signal for the DQ buffer in FIG. 8.

In this diagram, REF8K, REF4K, and REF2K are signals representing an 8K refresh cycle, 4K refresh cycle and 2K refresh cycle, respectively.

Figure 10:
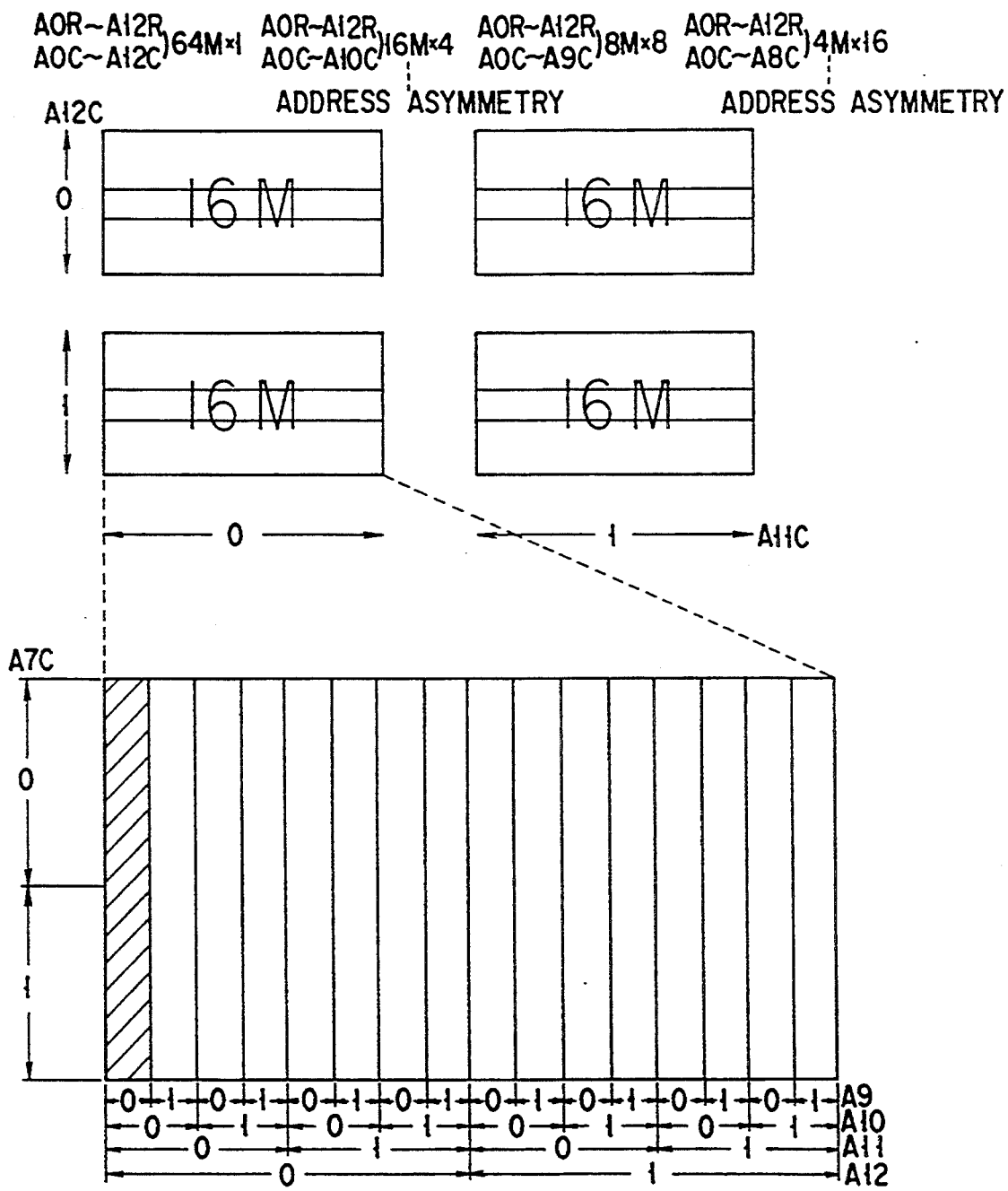
FIG. 10 is a diagram showing address allocation for 8K refresh device of a 64M DRAM.
Figure 11:
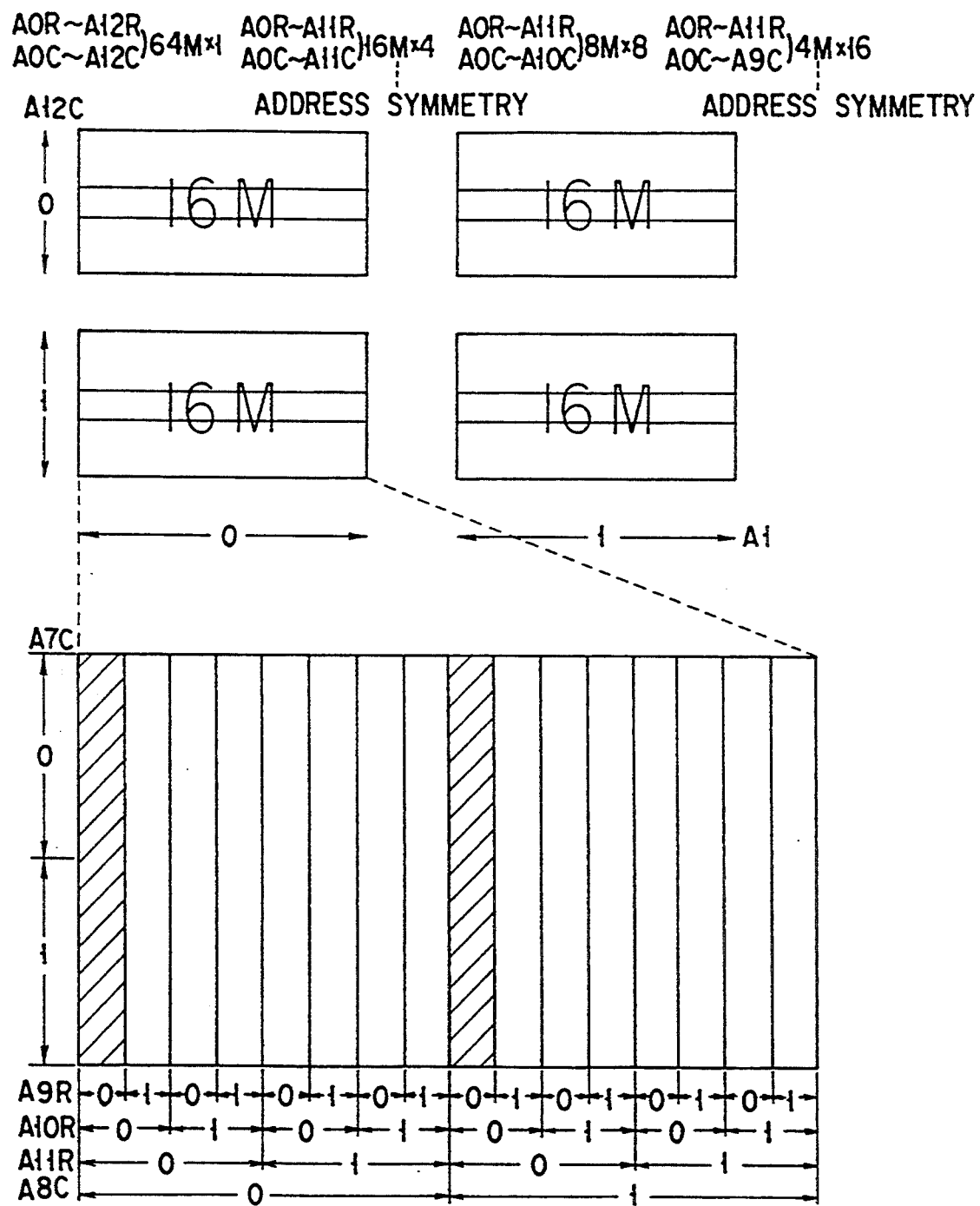
FIG. 11 is a diagram showing address allocation for 4K refresh device of a 64M DRAM.
Figure 12:
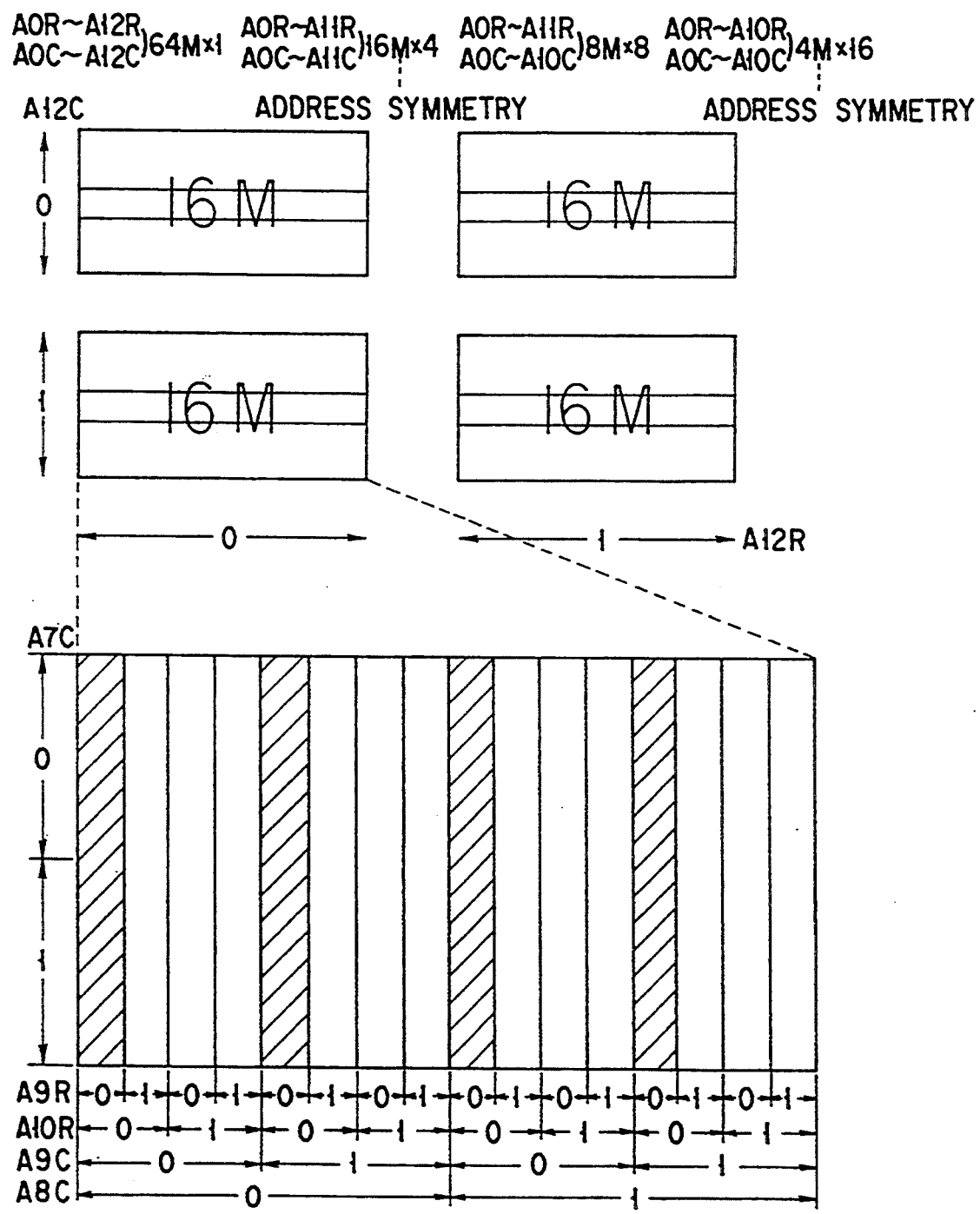
FIG. 12 is a diagram showing address allocation for 2K refresh device of a 64M DRAM.

There are three refresh cycles of a 64M DRAM: 8K refresh cycle shown in FIG. 10, 4K refresh cycle shown in FIG. 11 and 2K refresh cycle shown in FIG. 12. The hatched blocks in FIGS. 10 to 12 represent blocks which are simultaneously enabled.

As shown in FIG. 10, in the 8K refresh cycle, only one block is enabled for each 16M array during one cycle, and a total of four blocks (for example, four hatched blocks in FIG. 1) are simultaneously enabled. The same data can be written simultaneously in eight bits in the four block or can be read simultaneously therefrom. Therefore, it is possible to simultaneously write the same data in cells with a total of 32 bits, and simultaneously read data from 32 bits.

As shown in FIG. 11, in the 4K refresh cycle, only two blocks are enabled for each 16M array during one cycle, and a total of eight blocks are simultaneously enabled.

As shown in FIG. 12, in the 2K refresh cycle, only four blocks are enabled for each 16M array during one cycle, and a total of sixteen blocks are simultaneously enabled.

The address allocation differs from one refresh cycle to another, as shown in FIGS. 10 to 12.

The operation of the DQ-buffer control signal generator in FIG. 9 will be described below.

RSLn1 (n=0-7, 1=R, L) is a row block select signal, and QDRV is a pulse signal which becomes "H" in write mode. QSE is a signal to enable the DQ buffers in read mode.

In the 8K refresh cycle in normal operation mode, as REF2K="L" and REF8K="H," address signals A8C, /A8C, A9C and /A9C for determining the DQ-buffer group select signal QSEL all lose the selecting capability, the four QSEL signals all become "H," allowing only eight DQ buffers selected by the row block select signals RSLnL and RSLnR to be enabled.

In the 4K refresh cycle in normal operation mode, as REF2K="L" and REF8K="L," of the address signals to determined QSEL, only ASC and /ASC have the selecting capability, the DQ buffers which are enabled are only those corresponding to that one of the two blocks, selected by the row block select signals RSLnL and RSLnR, which is determined by A8C.

In the 2K refresh cycle in normal operation mode, as REF2K="H" and REF8K="L," four signals QSEL are completely decoded by A8C and A9C, and only those DQ buffers, which correspond to the selected one of the four simultaneously enabled blocks, are enabled. The refresh cycle in 32-bit parallel bit test mode is not different from that in normal operation mode. In 4-bit parallel bit test mode, however, the test is conducted in cycles equal to or smaller than the 4K refresh cycle (4K, 2K and 1K).

When the DRAM is a device of a 4K refresh cycle or less, the refresh cycle does not change even in 64-bit parallel bit test mode. If the DRAM is an 8K refresh cycle device, however, when the 64-bit parallel bit test mode is specified, the refresh cycle is compelled to be the 4K refresh cycle.

Further, the capability of A8C and /A8C to select QSEL is removed and the DQ buffers of those two blocks among the simultaneously enabled blocks which are determined by A8C, are enabled simultaneously.

Likewise, in 128-bit parallel bit test mode, the test is conducted in cycles equal to or less than the 2K refresh cycle. That is, the refresh cycle does not change for the 2K and 1K refresh cycle devices, while the refresh cycle for a 4K refresh cycle device is compelled to the 2K refresh cycle when the 128-bit parallel bit test mode is specified.

Further, the capability of A8C, /A8C, A9C and /A9C to select QSEL is removed. Accordingly, the DQ buffers of those four blocks among the simultaneously enabled blocks which are determined by A8C and A9C, are enabled simultaneously.

Likewise, in 256-bit parallel bit test mode, the test is conducted in the 1K refresh cycle. Therefore, the refresh cycle does not change for the 1K refresh cycle device, while the refresh cycle for the other types of devices is compelled to the 1K refresh cycle when the 256-bit parallel bit test mode is specified.

Further, the selecting capability of QSEL is removed and the DQ buffers of eight blocks selected by A8C, A9C and A10R are all enabled.

According to the system of this embodiment, the DQ buffers are shared by the blocks L and R in one block set, and further compression is impossible, so that a 512-bit parallel test cannot be conducted.

Figure 13:
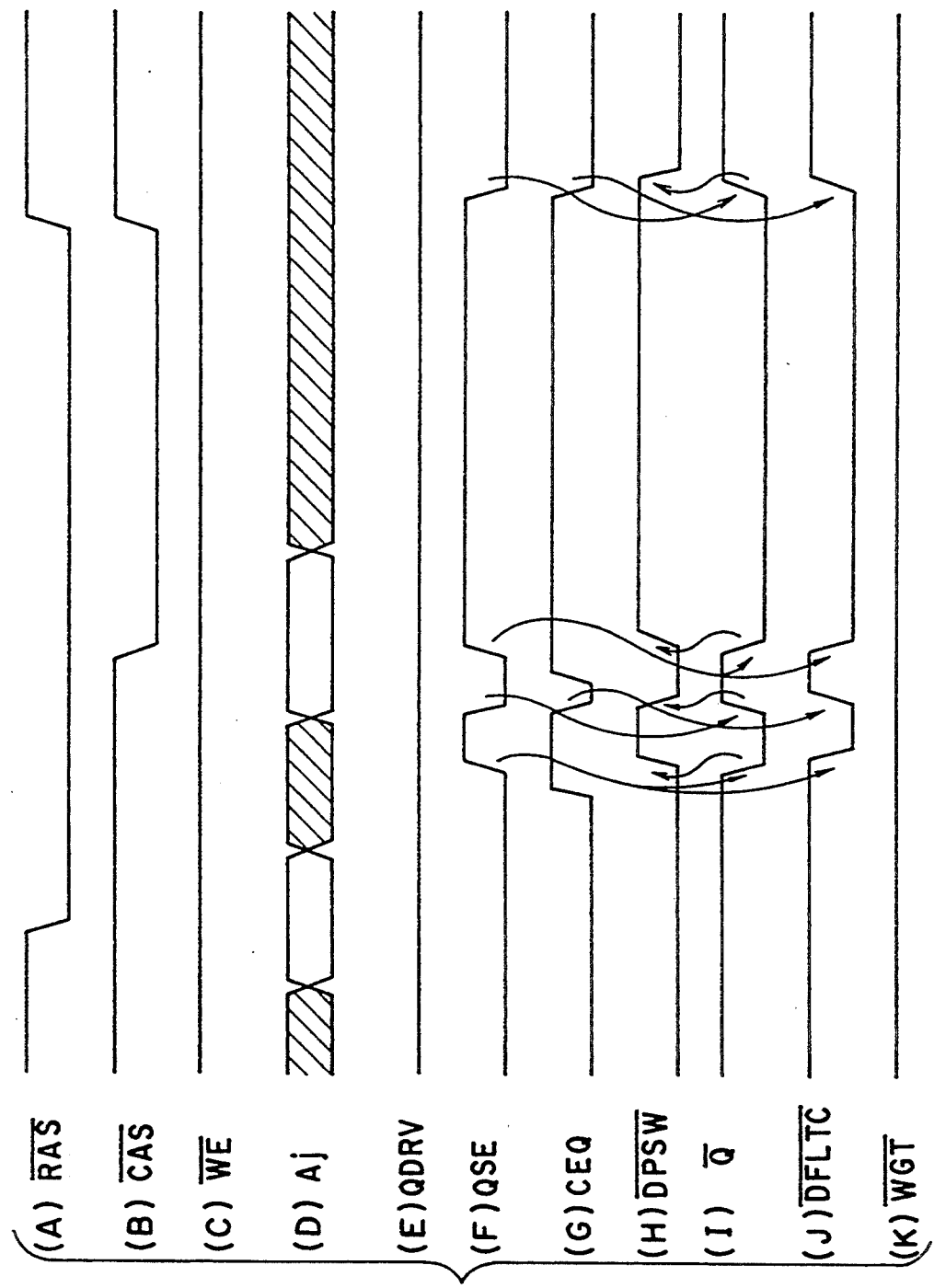
FIG. 13 is a timing waveform diagram illustrating one example of the read operation when the DQ buffer in FIG. 8 is selectively enabled.

FIG. 13 is a timing waveform diagram illustrating the read operation when the DQ buffer in FIG. 8 is selectively enabled.

In this diagram, QDRV is a pulse signal which becomes "H" in write mode and QSE is a signal to enable the DQ buffers in read mode.

The operation of the DQ buffer itself is well known, it will be described briefly. The row address is obtained at the same time an /RAS (row address strobe) signal is enabled, and then the column address is obtained at the same time a /CAS (column address strobe) signal is enabled, thereby selecting CSL, and the associated data is latched at the enabling timing of a /DFLTC signal. Although, prior to the above operation, CSL corresponding to the column address equal to the row address is selected and the associated data is latched, this is abandoned by the latching of data read out by the enabled /CAS signal (necessary data).

As apparent from the above-described structure and operation of the DQ buffers, when a plurality of DQ buffers connected to the same RWD line are simultaneously enabled in the system of this embodiment, those DQ buffers are wire-ORed to the RWD lines.

When the same data is written, therefore, if the data is read correctly, the written data is correctly read out onto the RWD lines and /RWD lines. If an error occurs in at least one bit of the same written data, RWD and /RWD (both precharged to "H") become an "L" level, permitting an error to be detected.

Although all the bits are in error, RWD and /RWD send inverted data and no error will be detected, but an error detection is possible at the portion (4-input NAND gate) in the read multiplexer in FIG. 6 which performs an operation on data from the other blocks. When all the bits in all the arrays are in error, no error detection is of course possible.

The writing system of the DRAM in FIG. 1 will now be described.

Figure 14:
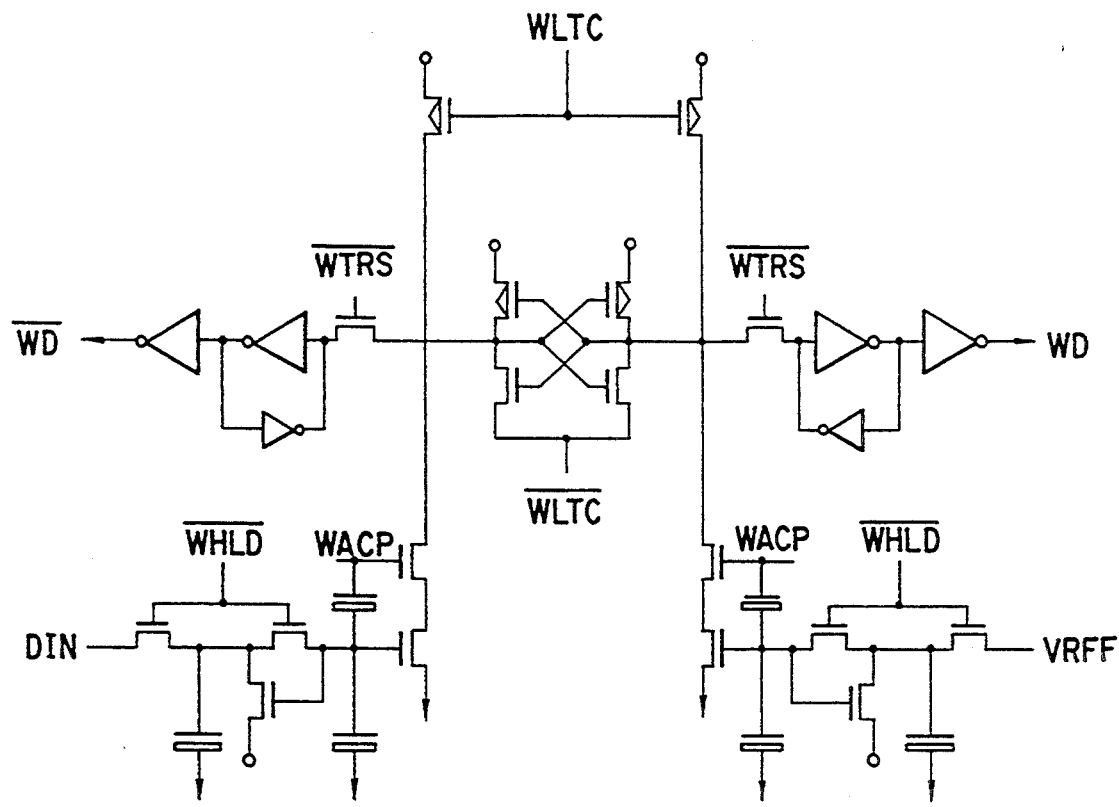
FIG. 14 is a circuit diagram showing one example of an input buffer circuit used in the DRAM in FIG. 1.

FIG. 14 shows one example of an input buffer circuit. As the structure of the input buffer circuit itself is well known, its description will not be given below. DIN is write data input from an input pad, and VREF is a reference voltage generated within the chip. DIN amplified by the input buffer circuit becomes complementary data WD and /WD to be input to the demultiplexer.

Figure 15:
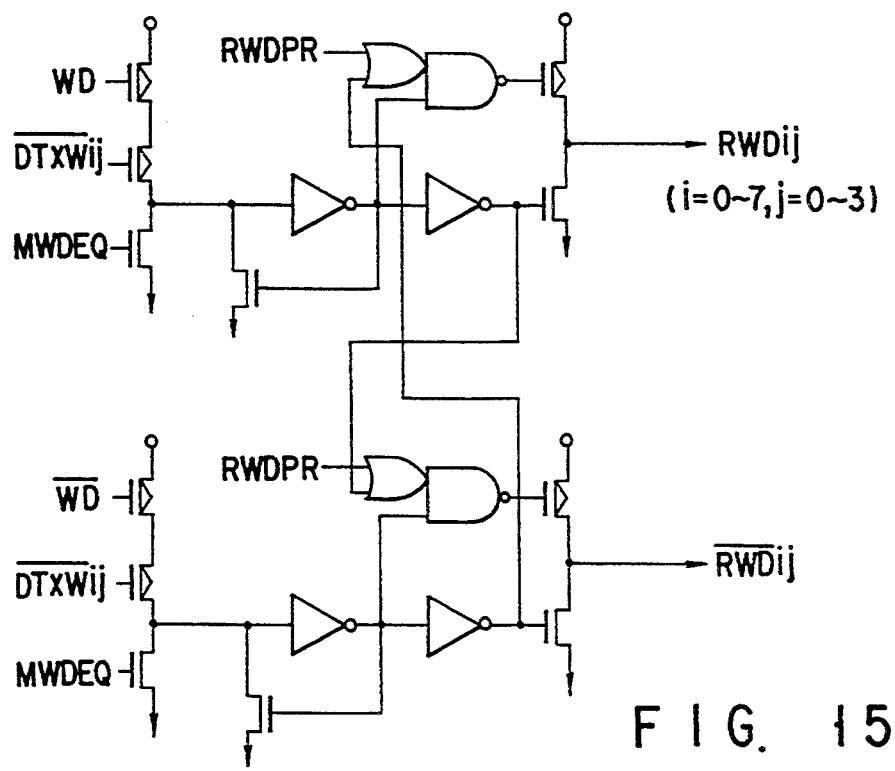
FIG. 15 is a circuit diagram showing one example of a demultiplexer used in the DRAM in FIG. 1.

FIG. 15 exemplifies the demultiplexer. As the structure of the demultiplexer itself is well known, its description will not be given below.

Figure 16:
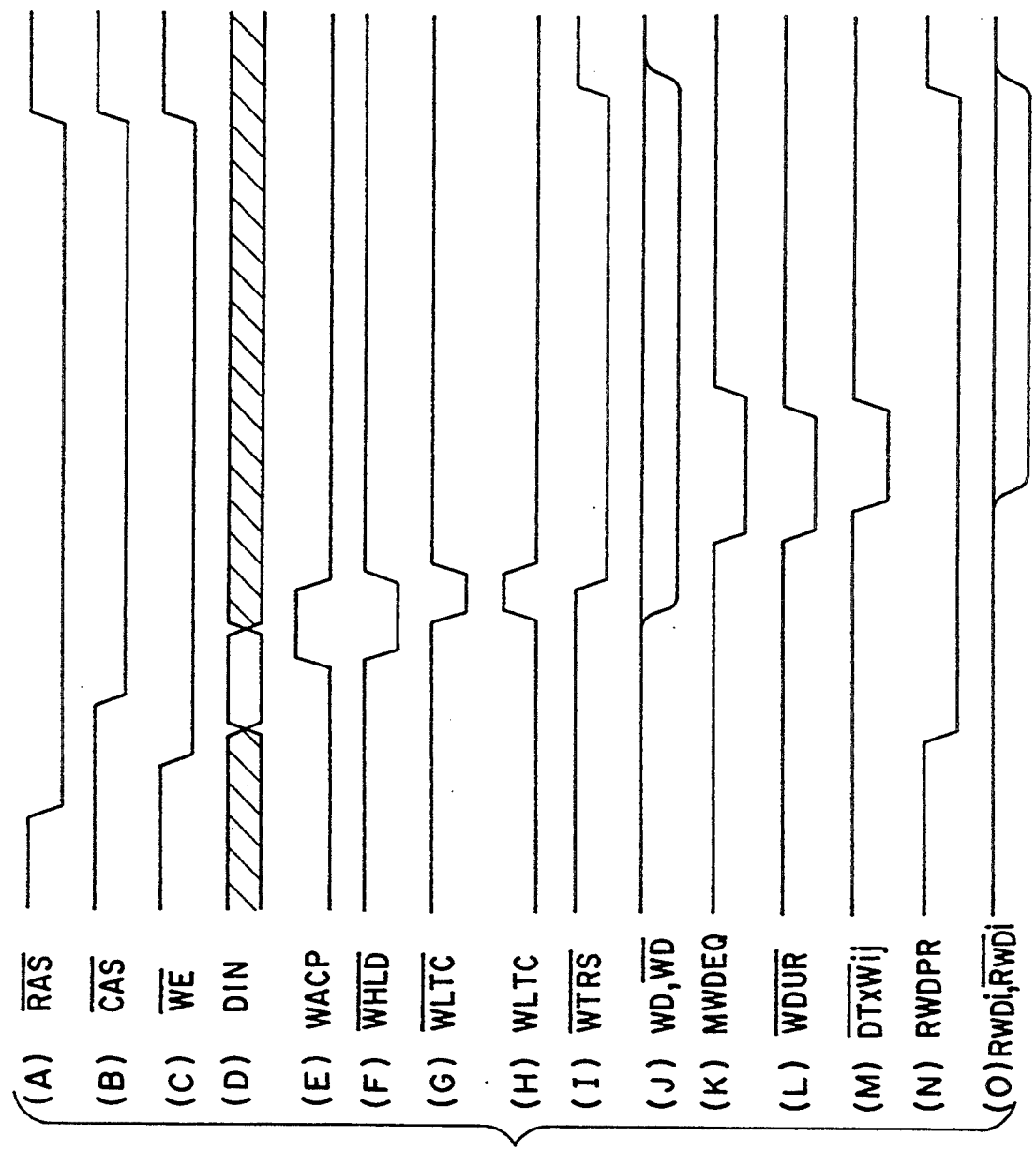
FIG. 16 is a timing waveform diagram exemplifying the operations of the circuits shown in FIGS. 14 and 15.

FIG. 16 presents a timing chart of control signals for the circuits shown in FIGS. 14 and 15.

The operations of the circuits in FIGS. 14 and 15 will be described below.

The input buffer circuit amplifies DIN and inputs it as complementary data WD and /WD to the demultiplexer. The demultiplexer sends WD and /WD onto pairs of RWDij and /RWDij (i=0-7; j=0-3) lines.

In this case, since only one signal among 8×4 /DTXWij signals (i=0-7; j=0-3) which is selected becomes a low level in normal operation mode, the data is selectively sent to the associated RWDij and /RWDij.

In 32-bit test mode, however, 8×4 /DTXWij signals all become a low level, so that the data is sent to all the RWD line pairs.

As described above, the write data transferred to the RWD line pairs is written in the DQ line pairs by the aforementioned circuits in FIGS. 8 and 9.

In normal mode, therefore, the data on the RWD line pairs is selectively written on the DQ line pairs by the /WGT signal selected by the RSLnL signal, RSLnR signal and QSEL signal in the circuit shown in FIG. 9.

In 32-bit test mode, however, the selecting capability of the QSEL signal is removed as in read mode to ensure simultaneous writing on multiple bits.

In this case, in 64-bit parallel test mode, if the test is conducted in the 4K or less refresh cycle, the refresh cycle for the 8K refresh cycle device is compelled to the 4K refresh cycle when the 64-bit parallel bit test mode is specified. As the selecting capability of A8C is removed in a QSEL generating section 91 in FIG. 9, the /WGT signals corresponding to those two blocks among the simultaneously enabled blocks which are distinguished by A8C, become a low level, allowing data to be written on the DQ line pairs.

Likewise, in 128-bit parallel test mode, if the test is conducted in the 2K or less refresh cycle, the refresh cycle for the 4K refresh cycle device or the 8K refresh cycle device is compelled to the 2K refresh cycle when the 128-bit parallel bit test mode is specified. As the selecting capability of A8C and A9C is removed in the QSEL generating section 91, the /WGT signals corresponding to those four blocks among the simultaneously enabled blocks which are distinguished by A8C and A9C, become a low level, allowing data to be written on the DQ line pairs.

Likewise, in 256-bit parallel test mode, if the test is conducted in the 1K refresh cycle, the refresh cycle for the 4K refresh cycle device or the 8K refresh cycle device is compelled to the 1K refresh cycle when the 256-bit parallel bit test mode is specified. As the selecting capability of QSE signal, RSLnR signal and RSLnL signal is removed in the QSEL generating section 91, the /WGT signals corresponding to those eight blocks among the simultaneously enabled blocks which are distinguished by A8C, A9C and A10R, become a low level, allowing data to be written on the associated DQ line pairs.

FIG. 17 shows one example of a generator for generating the /DTXRij signal of the read multiplexer in FIG. 6 and the /DTXWij signal of the demultiplexer in FIG. 15.

FIG. 18A shows one example of a generator for generating signals to determine refresh cycles in FIGS. 9 and 17, and FIGS. 18B and 18C present truth tables showing the statuses of the refresh cycle control signal in FIG. 18A.

REF8K, REF4K, REF2K and REF1K are signals which enable the word line WL respectively in the 8K refresh cycle, 4K refresh cycle, 2K refresh cycle and 1K refresh cycle, thereby enabling the sense amplifier.

Those signals are also input to the generator for generating the block select signals RSLnL and RSLnR, and the generator for generating signals to enable the word line driver and sense amplifier.

The parallel bit test mode of this invention is accomplished by increasing the number of enabled blocks although the bit width is doubled each time, the independency between bits can be maintained.

It is considered that if the test is conducted on a 4K refresh cycle device in 64-bit parallel mode, for example, the number of enabled blocks will not particularly increase, thus raising no problem, and if the test is conducted on a 8K refresh cycle device in 64-bit parallel mode, for example, the number of enabled blocks is doubled as compared with those in normal mode, which raises a problem that power, noise, etc. become larger as compared with those of the normal mode.

That is, it is considered that the test is conduced under conditions different from the normal conditions and accurate evaluation may not be performed.

However, the normal operation up to the 2K refresh cycle should originally be guaranteed, and the parallel bit test designed to shorten the time is actually to check the bit-by-bit function and is not intended to test or evaluate power or noise oriented defects.

If noise or the like is influential, as the parallel bit test is a test that is conducted under severer conditions than the normal conditions, devices which pass this test will be reliable and can be shipped and installed in associated apparatuses.

However, as the 1K refresh cycle 256-bit test mode) involves a very large number of blocks to be simultaneously enabled, the number of current peaks at the time of enabling the sense amplifier is too large so that there the chance of causing malfunction is very high. At this time, therefore, the driving power of the driver to enable the sense amplifier (the transistor size) may be suppressed to limit the amount of current.

Of course, this method requires a longer time to restore the bit lines (time to amplify the bit lines completely to "0" or "1"), requiring a longer cycle period. The reduced test time as a whole does not become a half of that in 128-bit test mode. But, since the ratio of the bit-line restoring time occupying in the cycle time is about ⅓, the test time can be shorted to ⅔ even if the number of enabled blocks is doubled.

There may however arise a problem when a 64-bit parallel test is conducted on this 8K refresh cycle device. In performing the 64-bit parallel test on the 8K refresh cycle device, the number of enabled blocks are doubled, so that if there are column defects with different addresses, the test cannot be conducted.

That is, when many bits are simultaneously tested with a refresh cycle smaller than the original refresh cycle of the device, the test may become impossible depending on the conditions of column defects.

To determine the above for each device, it is necessary to add information indicating how small the refresh cycle can become for each device.

There are various ways to accomplish this.

For example, in addition to the original refresh cycle information, information indicating how small the refresh cycle can become may be marked on the package.

Alternatively, the circuit shown in FIG. 19 may be provided in association with a plurality of I/O pads (I/O pins) 191, a redundancy fuse 192 is selectively cut before the assembling and after the test to program this circuit, and when a voltage higher than the source voltage Vcc is applied to the I/O pins 191 after assembling, it is checked if a current flows through the node between the I/O pins 191 and Vcc so that the information can be known.

while two NMOS transistors 193 and 194 are used in the circuit in FIG. 19, the number of the transistors is not limited to two or their type is not limited to NMOS. Further, diodes may be used in place of the transistors, and the pins to add the circuit in FIG. 19 are not limited to the I/O pins, but may be other pins, such as address pins, as well.

Although the foregoing description has been given with reference to the DRAM having a structure of 64M words×1 bit, this invention may be applied to multi-bit devices having bits increased by four times.

There may be various ways to enter the test mode in this invention. For example, it may be typical to enter the test mode by setting the row address when the /RAS signal is enabled in, for example, the WCBR cycle, thus allowing 32-bit, 64-bit, 128-bit and 256-bit parallel test modes to be distinguished.

As described above, the semiconductor memory embodying this invention will have a built-in test mode which can freely change the width the parallel test bits, and can make the compressed bit width of the parallel bit test in the case of a 64M DRAM, for example, greater than the standardized 32 bits, thus significantly shortening the test time. This contributes to reducing the cost needed for the test.

For example, when the test is conducted on a 64M DRAM in 256-bit parallel mode, all the bits can be accessed in the 256K cycle.

Assuming that the test items do not change, therefore, the functional test can be completed at the same time as the one required for a 256K DRAM. This effect is equivalent to the one of four generations ago, and causes great impact on reducing the test cost.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory with a built-in parallel bit test mode, comprising:

a memory cell array laid out as a plurality of blocks;
   plural pairs of data lines provided for each of said blocks;
   plural pairs of read/write lines commonly provided for and in a vicinity of each of said blocks;
   a plurality Of DQ buffer circuits, respectively provided for said blocks, for each amplifying data output on said plural pairs of data lines from an associated one of said blocks and sending resultant amplified data onto those plural pairs of read/write lines which are associated with that block in read mode, and writing data, written on those associated plural pairs of read/write lines, on said associated plural pairs of data lines in write mode; and
   a test circuit for performing control in such a way that, when a parallel bit test mode is designated, said test circuit enables those DQ buffer circuits which are equal or greater in number than those DQ buffer circuits needed for normal reading/writing to... connect said associated plural pairs of read/write lines in wired-OR fashion and to read out results of computation of pieces of data equal to or greater in number than said plural pairs of read/write lines onto said plural pairs of read/write lines in read mode, and to write the same data on those plural pairs of data lines equal to or greater in number than said plural pairs of read/write lines,
   wherein said plurality of DQ buffer circuits and said test circuit are incorporated in a DRAM and a symbol or a mark indicating a minimum possible refresh cycle is affixed on a package of said DRAM.

2. A semiconductor memory with a built-in parallel bit test mode, comprising:

a memory cell array laid out as a plurality of blocks:
   plural pairs of data lines provided for each of said blocks;
   plural pairs of read/write lines commonly provided for and in a vicinity of each of said blocks;
   a plurality of DQ buffer circuits, respectively provided for said blocks, for each amplifying data output on said plural pairs of data lines from an associated one of said blocks and sending resultant amplified data onto those plural pairs of read/write lines which are associated with that block in read mode, and writing data, written on those associated plural pairs of read/write lines on said associated plural pairs of data lines in write mode; and
   a test circuit for performing control in such a way that, when a parallel bit test mode is designated, said test circuit enables those DQ buffer circuits which are equal or greater in number than those DQ buffer circuits needed for normal reading/writing to connect said associated plural pairs of read/write lines in wired-OR fashion and to read out results of computation of pieces of data equal to or greater in number than said plural pairs of read/write lines onto said plural pairs of read/write lines in read mode, and to write the same data on those plural pairs of data lines equal to or greater in number than said plural pairs of read/write lines, wherein said plurality of DQ buffer circuits and said test circuit are incorporated in a DRAM, and said semiconductor memory further comprises a circuit for programming a minimum possible refresh cycle in association with any external pin of said DRAM in such a way that contents of a program is detectable after sealing said DRAM in a package.

3. A semiconductor memory with a built-in parallel bit test mode, comprising:

a memory cell array laid out as a plurality of blocks;

plural pairs of data lines provided for each of said blocks;

plural pairs of read/write lines commonly provided for and in a vicinity of each of said blocks;

a plurality of DQ buffer circuits, respectively provided for said blocks, for each amplifying data output on said plural pairs of data lines from an associated one of said blocks and sending resultant amplified data onto those plural pairs of read/write lines which are associated with that block in read mode, and writing data, written on those associated plural pairs of read/write lines, on said associated plural pairs of data lines in write mode; and a test circuit for performing control in such a way that, when a parallel bit test mode is designated, said test circuit enables those DQ buffer circuits which are equal or greater in number than those DQ buffer circuits needed for normal reading/writing to connect said associated plural pairs of read/write lines in wired-OR fashion and to read out results of computation of pieces of data equal to or greater in number than said plural pairs of read/write lines onto said plural pairs of read/write lines in read mode, and to write the same data on those plural pairs of data lines equal to or greater in number than said plural pairs of read/write lines, wherein in parallel bit test mode, said test circuit reduces driving power of a sense amplifier driver in normal mode.

4. The semiconductor memory according to claim 3, wherein said individual circuits are incorporated in a DRAM; and a symbol or a mark indicating a minimum possible refresh cycle is affixed on a package of said DRAM.

5. The semiconductor memory according to claim 3, wherein said plurality of DQ buffer circuits and said test circuit are incorporated in a DRAM; and said semiconductor memory further comprises a circuit for programming a minimum possible refresh cycle in association with any external pin of said DRAM in such a way that contents of a program is detectable after sealing said DRAM in a package.

6. A semiconductor memory with a built-in parallel bit test mode, comprising:

a memory cell array laid out as a plurality of blocks;

plural pairs of data lines provided for each of said blocks;

plural pairs of read/write lines commonly provided for and in a vicinity of each of said blocks;

a plurality of DQ buffer circuits, respectively provided for said blocks, for each amplifying data output on said plural pairs of data lines from an associated one of said blocks and sending resultant amplified data onto those plural pairs of read/write lines which are associated with that block in read mode, and writing data, written on those associated plural pairs of read/write lines, on said associated plural pairs of data lines in write mode; and a test circuit for performing Control in such a way that, when a parallel bit test mode is designated, said test circuit enables those DQ buffer circuits which am equal or greater in number than those DQ buffer circuits needed for normal reading/writing to connect said associated plural pairs of read/write lines in wired-OR fashion and to read out results of computation of pieces of data equal to or greater in number than said plural pairs of read/write lines onto said plural pairs of read/write lines in read mode, and to write the same data on those plural pairs of data lines equal to or greater in number than said plural pairs of read/write lines, wherein said test circuit enters said parallel bit test mode in a special entry cycle or by applying an electrical signal to pads on a memory chip area, thereby freely changing the number of bits to be simultaneously tested.

7. The semiconductor memory according to claim 6, wherein in parallel bit test mode, said test circuit reduces driving power of a sense amplifier driver in normal mode.

8. The semiconductor memory according to claim 7, wherein said plurality of DQ buffer circuits and said test circuit are incorporated in a DRAM; and said semiconductor memory further comprises a circuit for programming a minimum possible refresh cycle in association with any external pin of said DRAM in such a way that contents of a program is detectable after sealing said DRAM in a package.

9. The semiconductor memory according to claim 8, wherein said special entry cycle is acknowledged by means of a WCBR cycle accompanied with an entry of a predetermined signal.

10. The semiconductor memory according to claim 7, wherein said special entry cycle is acknowledged by means of a WCBR cycle accompanied with an entry of a predetermined signal.

11. The semiconductor memory according to claim 7, wherein said individual circuits are incorporated in a DRAM; and a symbol or a mark indicating a minimum possible refresh cycle is affixed on a package of said DRAM.

12. The semiconductor memory according to claim 11, wherein said special entry cycle is acknowledged by means of a WCBR cycle accompanied with an entry of a predetermined signal.

13. The semiconductor memory according to claim 6, wherein said special entry cycle is ackowledged by means of a WCBR cycle accompanied with an entry of a predetermined signal.

14. The semiconductor memory according to claim 6, wherein said plurality of DQ buffer circuits and said test circuit are incorporated in a DRAM; and a symbol or a mark indicating a minimun, possible refresh cycle is affixed on a package of said DRAM.

15. The semiconductor memory according to claim 14, wherein said special entry cycle is acknowledged by means of a WCBR cycle accompanied with an entry of a predetermined signal.

16. The semiconductor memory according to claim 6, wherein said plurality of DO buffer circuits and said test circuit are incorporated in a DRAM; and said semiconductor memory further comprises a circuit for programming a minimum possible refresh cycle in association with any external pin of said DRAM in such a way that contents of a program is detectable after sealing said DRAM in a package.

17. The semiconductor memory according to claim 16, wherein said special entry cycle is acknowledged by means of a WCBR cycle accompanied with an entry of a predetermined signal.

* * * * *